(12) United States Patent
Yang

(10) Patent No.: US 8,999,835 B2
(45) Date of Patent: Apr. 7, 2015

(54) METHOD AND STRUCTURE OF MONOLITHICALLY INTEGRATED ESD SUPPERSSION DEVICE

(75) Inventor: Xiao (Charles) Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 183 days.

(21) Appl. No.: 13/410,273

(22) Filed: Mar. 1, 2012

(65) Prior Publication Data

US 2013/0065387 A1 Mar. 14, 2013

Related U.S. Application Data

(63) Continuation of application No. 12/511,002, filed on Jul. 28, 2009, now Pat. No. 8,148,781.

(60) Provisional application No. 61/084,226, filed on Jul. 28, 2008.

(51) Int. Cl.
*H01L 27/02* (2006.01)
*H01L 23/60* (2006.01)
*H01L 23/00* (2006.01)

(52) U.S. Cl.
CPC .......... *H01L 27/0248* (2013.01); *H01L 23/60* (2013.01); *H01L 24/05* (2013.01)

(58) Field of Classification Search
CPC .................. H01L 2924/00; H01L 2924/0002; H01L 21/76243; H01L 21/76267; H01L 21/763
USPC .................................. 438/600; 257/E21.591
IPC ..... H01L 2924/0132, 2924/01013, 2224/73265, H01L 2224/48227, 2224/32225
See application file for complete search history.

(56) References Cited

U.S. PATENT DOCUMENTS

| | | | |
|---|---|---|---|
| 4,612,083 | A | 9/1986 | Yasumoto |
| 5,090,963 | A | 2/1992 | Gross et al. |
| 5,135,499 | A | 8/1992 | Tafani et al. |
| 5,808,350 | A | 9/1998 | Jack et al. |
| 6,097,066 | A | 8/2000 | Lee et al. |
| 6,287,940 | B1 | 9/2001 | Cole et al. |
| 6,307,194 | B1 | 10/2001 | Fitzgibbons et al. |
| 6,393,913 | B1 | 5/2002 | Dyck et al. |
| 6,635,509 | B1 | 10/2003 | Ouellet |
| 6,936,524 | B2 | 8/2005 | Zhu et al. |
| 7,091,057 | B2 | 8/2006 | Gan et al. |
| 7,470,957 | B2 | 12/2008 | Gassner |

(Continued)

OTHER PUBLICATIONS

Notice of Allowance for U.S. Appl. No. 12/511,002, mailed on Dec. 1, 2011, 7 pages.

(Continued)

*Primary Examiner* — Tony Tran
(74) *Attorney, Agent, or Firm* — Kilpatrick Townsend & Stockton LLP

(57) ABSTRACT

A method of fabricating ESD suppression device includes forming conductive pillars dispersed in a dielectric material. The gaps formed between each pillar in the device behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical gaps between the conductive pillars. The proposed method for fabricating an ESD suppression device includes micromachining techniques to be on-chip with device ICs.

18 Claims, 7 Drawing Sheets

(56) References Cited

U.S. PATENT DOCUMENTS

| | | |
|---|---|---|
| 7,536,769 B2 | 5/2009 | Pedersen |
| 7,538,311 B2 | 5/2009 | Watanabe |
| 7,709,896 B2 | 5/2010 | Russ et al. |
| 7,885,423 B2 | 2/2011 | Weigold |
| 7,887,508 B2 | 2/2011 | Meng et al. |
| 7,943,412 B2 | 5/2011 | Buchwalter et al. |
| 8,071,398 B1 | 12/2011 | Yang |
| 8,148,781 B2 | 4/2012 | Yang |
| 8,227,911 B1 | 7/2012 | Yang |
| 2002/0039838 A1 | 4/2002 | Iida et al. |
| 2002/0190210 A1 | 12/2002 | Ishikawa et al. |
| 2003/0107097 A1* | 6/2003 | McArthur et al. ............ 257/414 |
| 2003/0215976 A1* | 11/2003 | Chou et al. ..................... 438/57 |
| 2004/0068224 A1 | 4/2004 | Couvillon et al. |
| 2005/0067620 A1 | 3/2005 | Chan |
| 2005/0224714 A1 | 10/2005 | Akin et al. |
| 2006/0087430 A1 | 4/2006 | Zambon |
| 2006/0087717 A1 | 4/2006 | McGinley et al. |
| 2006/0205106 A1 | 9/2006 | Fukuda et al. |
| 2006/0244067 A1 | 11/2006 | Socher et al. |
| 2006/0274399 A1 | 12/2006 | Yang |
| 2007/0097487 A1 | 5/2007 | Yang |
| 2008/0039792 A1 | 2/2008 | Meng et al. |
| 2008/0283991 A1 | 11/2008 | Reinert |
| 2009/0278217 A1 | 11/2009 | Laming et al. |
| 2010/0014146 A1* | 1/2010 | Lan ............................... 359/290 |
| 2010/0075481 A1 | 3/2010 | Yang |
| 2010/0164025 A1 | 7/2010 | Yang |

OTHER PUBLICATIONS

Amantea et al., "An Uncooled IR Imager with 5 mK NEDT," SPIE vol. 3061, pp. 210-222, 1997.

Cole et al., "Monolithic Two-Dimensional Arrays of Micromachined Microstructures for Infrared Applications," Proceedings of the IEEE, vol. 86, No. 8, pp. 1679-1686, Aug. 1998.

Radford et al., "Microbolometer Uncooled Infrared Camera With 20 mK NETD," SPIE Conf. on Infrared Technology and Applications XXIV, SPIE vol. 3436, pp. 636-646, Jul. 1998.

Su et al. "A Resonant Accelerometer with Two-Stage Micro-leverage Mechanisms Fabricated by SOI-MEMS Technology", IEEE Sensors Journal, 5 (6), pp. 1214-1223, 2005 ).

U.S. Appl. No. 13/311,538, Final Office Action mailed Aug. 27, 2013, 9 pages.

\* cited by examiner

METHOD AND STRUCTURE OF MONOLITHICALLY INTEGRATED ESD SUPPERSSION DEVICE

CROSS-REFERENCES TO RELATED APPLICATIONS

This is a continuation application of U.S. patent application Ser. No. 12/511,002, filed Jul. 28, 2009, entitled "METHOD AND STRUCTURE OF MONOLITHICALLY INTEGRATED ESD SUPPRESSION DEVICE" by inventor XIAO (CHARLES) YANG, which claims priority to U.S. Provisional Patent Application Ser. No. 61/084,226, filed Jul. 28, 2008, entitled "METHOD AND STRUCTURE OF MONOLITHICALLY INTEGRATED ESD SUPPRESSION DEVICE" by inventor XIAO (CHARLES) YANG, both of which are commonly assigned and incorporated by reference herein for all purposes.

BACKGROUND OF THE INVENTION

This present invention relates in general to protection of integrated circuit chips, and more particularly, to a micromachined suppression device for protecting integrated circuit chips from electrostatic discharges or other potentially damaging voltage transients occurring during device fabrication and in use in field.

Electrostatic discharge (ESD) is a phenomenon known to degrade or destroy electronic components. In particular, given the decreasing size of circuit features with ever improving process technology, static electricity can destroy or substantially harm many of today's integrated circuits. Electrostatic discharge can occur, for example, from human handling, automated circuit testing or as a packaged circuit slides on its pins across another surface. The circuits most susceptible to damage are unpackaged or packaged finished circuits which have not yet been installed into a finished product. Once installed, for example, onto a circuit card, other means exist to protect the circuits from damage.

Various techniques have been employed to protect integrated circuit chips handled by humans during the fabrication process. These methods include special handling procedures, use of grounding equipment and the addition of protective components to the chip circuitry. The most popular technique used to protect complementary metal-oxide semiconductor (CMOS) circuits from an ESD event is the addition of diffused or implanted dual clamping diodes to clamp input and output voltages to within the boundaries of the chip's power supply connections. Such dual diodes are coupled between the input/output pads of the circuit and the pins to which the power supplies are connected. With an electrostatic discharge event of one polarity, a first diode is forward biased and with a discharge event of the opposite polarity, the second diode is forward biased. Other methods used for protecting CMOS circuits from electrostatic discharge damage are typically variations on this dual diode clamping approach. A variety of technologies are used for ESD protection both on-chip and off-chip. However, the incumbent technologies have limitations.

Furthermore, while most circuit protection needs for portable and wireless devices can be met with discrete devices, space and higher-volume manufacturing are also dictating use of integrated passive devices.

Thus, it is desirable to improve ESD suppression devices.

BRIEF SUMMARY OF THE INVENTION

This present invention relates in general to protection of integrated circuit chips, and more particularly, to a micromachined suppression device for protecting integrated circuit chips from electrostatic discharges or other potentially damaging voltage transients occurring during device fabrication and in use in field.

The proposed ESD suppression device consists of conductive pillars are dispersed in a dielectric material. The gaps between each pillar behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical gaps between the conductive pillars.

The proposed ESD suppression device is fabricated using micromachining techniques. In a embodiment, the ESD suppression device is fabricated on-chip with device ICs. In another embodiment, the ESD suppression device is a stand-alone discrete component.

DETAILED DESCRIPTION OF THE INVENTION

According to the present invention, techniques for fabricating ESD suppression device are provided. More particularly, the invention includes a method and structure for fabricating ESD suppression device with conductive pillars are dispersed in a dielectric material. Merely by way of example, the invention has been applied to fabricating ESD suppression device. But it would be recognized that the invention has a much broader range of applicability.

Figure 1:
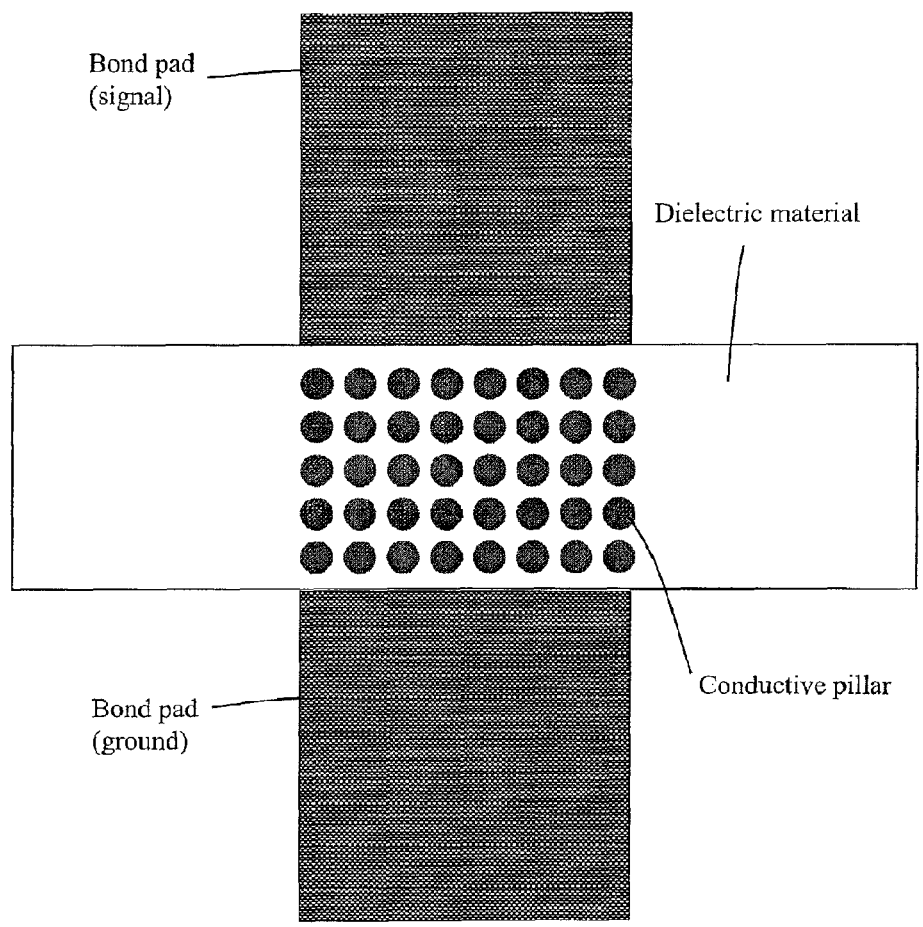
FIG. 1 is a simplified top-view diagram illustrating components of a pillar ESD suppression device according to one embodiment of the present invention.

FIG. 1 is a simplified top-view diagram illustrating components of a pillar ESD suppression device according to one embodiment of the present invention. The following diagrams are merely examples, which should not unduly limit the scope of the claims herein. One of ordinary skill in the art would recognize many variations, alternatives, and modifications.

As illustrated, the pillar ESD suppression device is consisted of a pair of electrodes with conductive pillars dispersed in a dielectric material. The conductive pillars are made of conductive materials such as Al, Cu, W, Au, Ti, TiN, TiW, doped silicon, or conductive polymers. The dielectric material includes not limit to silicon dioxide, silicon nitride, spinon glass, non-conductive polymers, inert gases, or vacuum. In an embodiment, the spacing or gap between the pillars is a constant ranging from 10 s nanometers to 10 s micrometers. In another embodiment, the spacing or gap between the pillars is a variable ranging from 10 s nanometers to 10 s micrometers.

Figure 2:
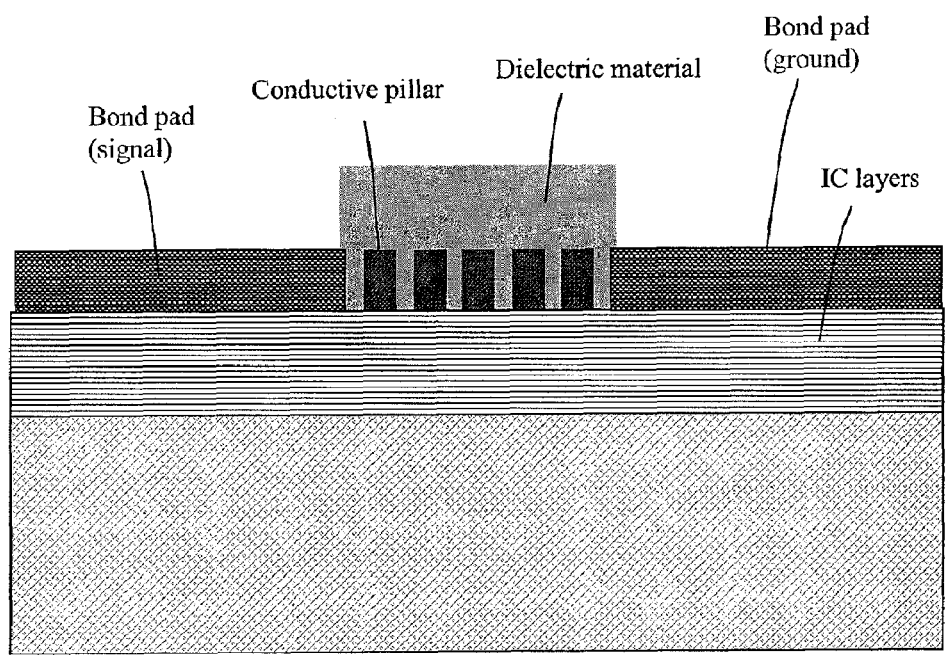
FIG. 2 is a simplified cross-sectional diagram illustrating components of a pillar ESD suppression device according to one embodiment of the present invention.

FIG. 2 is a simplified cross-sectional diagram illustrating components of a pillar ESD suppression device according to one embodiment of the present invention. As illustrated, the conductive pillars are dispersed in a dielectric material. The height of the pillars ranges from 100 s nanometers to 10 s micrometers. In an embodiment, the pillar ESD suppression is fabricated on top of an integrated circuit (IC) device. In another embodiment, the pillar ESD suppression is fabricated on top of a substrate without integrated circuit (IC) device.

Figure 3:
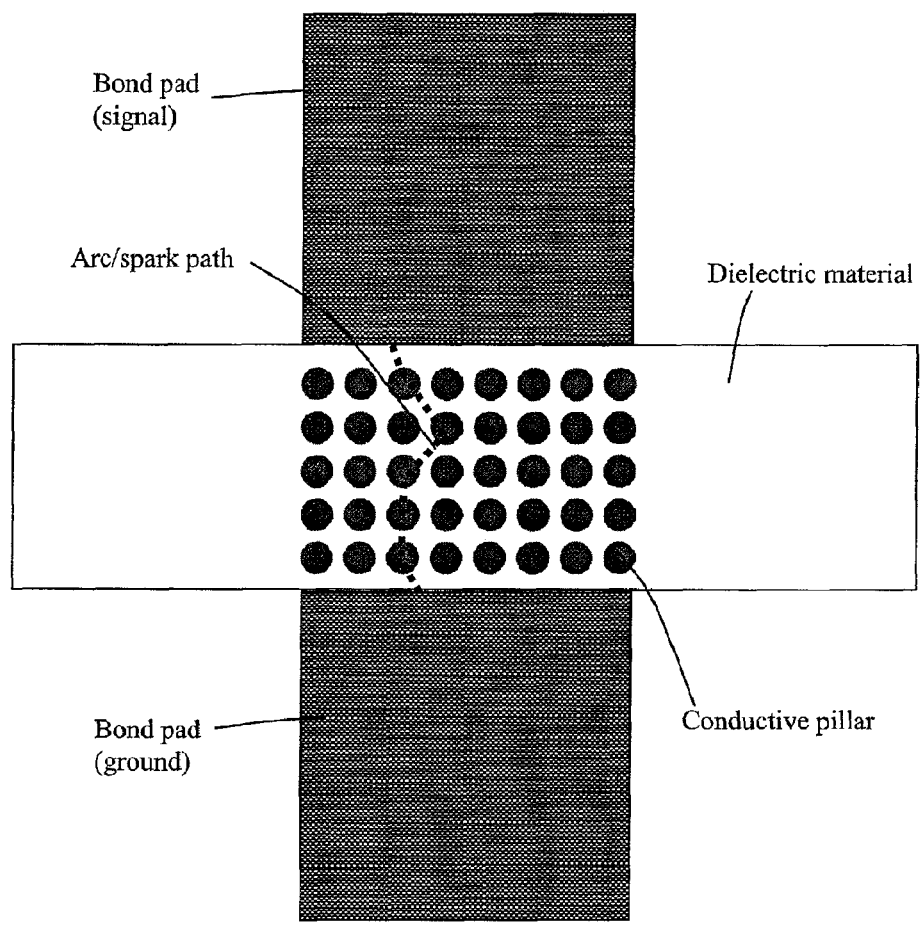
FIG. 3 is a simplified top-view diagram illustrating working principle of a pillar ESD suppression according to one embodiment of the present invention.

FIG. 3 is a simplified top-view diagram illustrating working principle of a pillar ESD suppression according to one embodiment of the present invention. As depicted, the gaps between each pillar behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical separation gaps between the conductive pillars.

Figure 4:
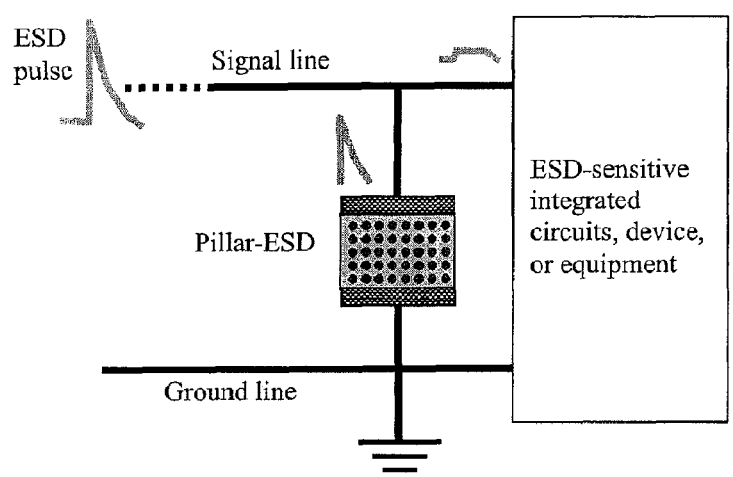
FIG. 4 is a simplified block diagram illustrating of a typical ESD protection-wiring scheme using a pillar ESD suppression device according to one embodiment of the present invention.

FIG. 4 is a simplified block diagram illustrating of a typical ESD protection-wiring scheme using a pillar ESD suppression device according to one embodiment of the present invention. As depicted, pillar ESD suppression device is 'shunted' between a signal line and ground line before the ESD sensitive device or equipment. When an ESD pulse occurs on the signal line and reaches the "trigger voltage", the pillar ESD suppression device creates a very low resistance path that shunts the high voltage ESD pulse to the ground and leaves a safe 'clamped' portion of the signal goes into an integrated circuits, electronic device or equipment. In normal operation, the leakage current and the capacitance is very low, due to the physical separation gaps between the conductive pillars.

Figure 5:
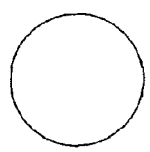
FIG. 5 is a simplified top-view diagram illustrating variations of the pillar shapes of a pillar ESD suppression device according to one embodiment of the present invention.
Figure 5:
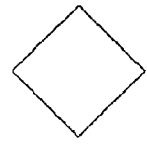
Figure 5:
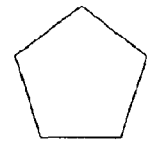
Figure 5:
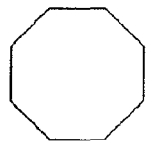
Figure 5:
Figure 5:
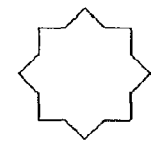

FIG. 5 is a simplified top-view diagram illustrating variations of the pillar shapes of a pillar ESD suppression device according to one embodiment of the present invention. As depicted, the pillar ESD suppression device may have different shapes of pillars. The pillar shape works in concert with the pillar spacing to determine the arc or spark voltage level. The pillar ESD suppression device may have one or more shapes of pillars.

Figure 6:
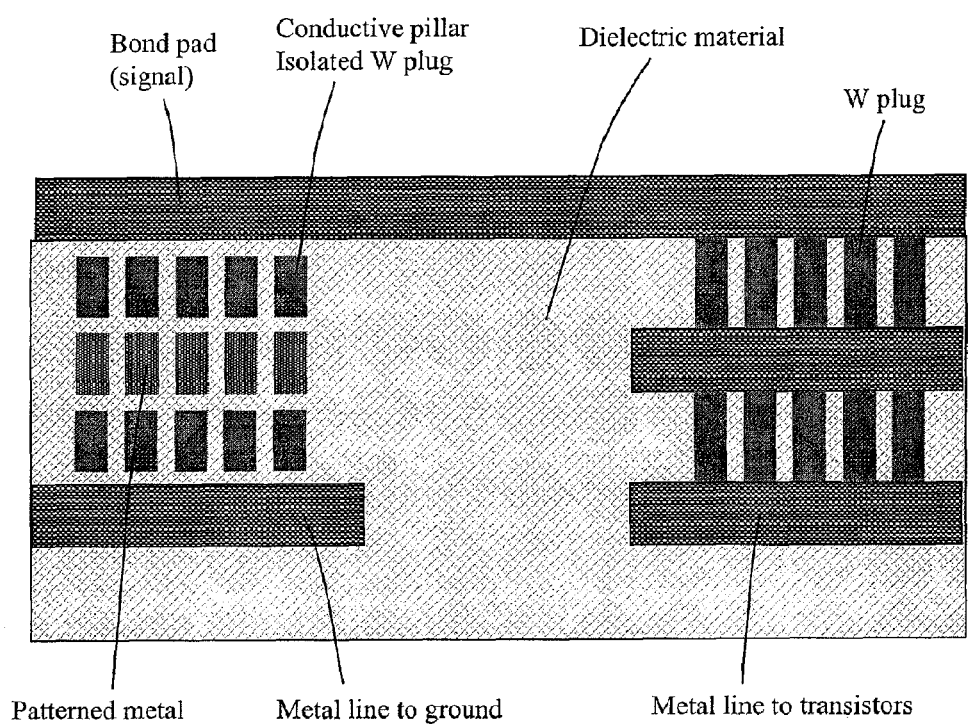
FIG. 6 is a simplified cross-sectional diagram illustrating components of a pillar ESD suppression device according to one embodiment of the present invention.

FIG. 6 is a simplified cross-sectional diagram illustrating components of a pillar ESD suppression device according to one embodiment of the present invention. As illustrated, the conductive pillars are dispersed in a dielectric material in a vertical configuration. The pillars are consisted of isolated tungsten plugs and patterned metal that are dispersed in a dielectric materials such as oxide. In a specific embodiment, the top metal of the ESD device is a portion of a bond pad and the bottom metal connects to a ground.

Figure 7:
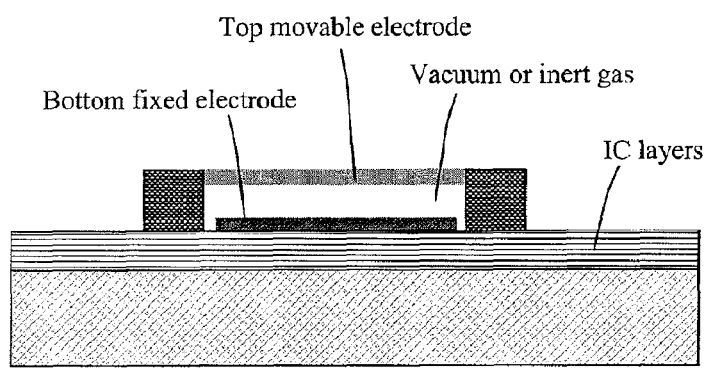
FIG. 7 is a simplified cross section view diagram illustrating another configuration of the pillar shapes of a pillar ESD suppression device according to one embodiment of the present invention.

FIG. 7 is a simplified cross section view diagram illustrating another configuration of the pillar shapes of a pillar ESD suppression device according to one embodiment of the present invention. As depicted, the pillar ESD suppression device consists of a top moving electrode and a bottom fixed electrode. The gap between the top and bottom electrodes is a vacuum or an inert gas depending on specific ESD suppression requirements. When the voltage of the ESD pulse reaches the "trigger voltage", the top movable electrode is 'pulled in' and collapse to the bottom electrode and create a very low resistance path. In normal operation, the leakage current and the capacitance is very low, due to the physical gaps that separates the top and bottom electrodes.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an electrostatic discharge device for an integrated circuit, the method comprising:
   providing a semiconductor substrate;
   forming a voltage discharge region overlying an inner portion of the semiconductor substrate, the forming of the voltage discharged region comprising:
   forming a plurality of isolated conductive regions arranged as a vertical array, the array being numbered from 1 through N in a first direction and the array being numbered from 1 through M in a second direction; each of me conductive regions comprising an isolated tungsten plug;
   forming a dielectric material provided spatially around each of the isolated conductive regions to form a thickness of material having a surface region, wherein each of the conductive regions is physically separated from the other conductive regions by a portion of the dielectric material;
   forming an input region coupled to a first region of the plurality of conductive regions;
   forming an output region coupled to a second region of the plurality of conductive regions;
   forming an input line overlying a first region of the semiconductor substrate region and coupled to the input region of the plurality of conductive regions;
   forming an output line overlying a second region of the semiconductor substrate region and coupled to the output region of the plurality of conductive regions;
   further comprising coupling the output line to a ground potential; and
   wherein the dielectric material is selected from air, silicon dioxide, silicon nitride, and silicon oxynitride.

2. The method of claim 1 further comprising coupling the input line to a bond pad.

3. The method of claim 1 further comprising coupling the input line to an input pad.

4. The method of claim 1 further comprising coupling the input line to one or more integrated circuit modules.

5. The method of claim 1 further comprising coupling the output line to one or more integrated circuit modules.

6. The method of claim 1 wherein forming the plurality of conductive regions comprises forming a plurality of pillars.

7. The method of claim 1 wherein forming the plurality of conductive regions includes forming each of the plurality of conductive regions as a shape characterized by a column.

8. The method of claim 1 wherein forming the dielectric material includes separating each pair of the conductive regions by a portion of the dielectric material.

9. The method of claim 1 wherein forming the plurality of conductive regions includes forming at least two of the conductive regions separated by a predetermined gap, the gap including a portion of dielectric material therein provided a breakdown voltage between the two conductive regions.

10. The method of claim 1 wherein the array is formed in a regular pattern.

11. The method of claim 1 wherein the array is formed in an irregular pattern.

12. The method of claim 1 wherein forming the one or more of the conductive regions comprises forming a regular shape or forming the one or more of the conductive regions comprises forming an irregular shape.

13. The method of claim 1 wherein forming the voltage discharge region comprises forming the plurality of conductive regions overlying the dielectric layer.

14. The method of claim 1 wherein forming the plurality of conductive regions includes a micromachining process.

15. The method of claim 1 wherein the first direction and the second direction are parallel to the semiconductor substrate.

16. The method of claim 1 wherein the first direction and the second direction are normal to the semiconductor substrate.

17. The method of claim 1 wherein each of the plurality of conductive regions includes a pillar structure have a cross-sectional shape selected from: a circle, a square, a pentagon, a hexagon, a star, and a hexadecagon.

18. A method for fabricating an electrostatic discharge device for an integrated circuit, the method comprising:
   providing a semiconductor substrate;
   forming a voltage discharge region overlying an inner portion of the semiconductor substrate, the forming of the voltage discharged region comprising:
   forming a plurality of isolated conductive pillars arranged as a vertical array, the array being numbered from 1 through N in a first direction and the array being numbered from 1 through M in a second direction, each of the conductive pillars comprising an isolated tungsten plug;
   forming a dielectric material provided spatially around each of the isolated conductive pillars to form a thickness of material having a surface region, wherein each of the conductive pillars is only in physical contact with the dielectric material and is physically separated from the other conductive pillars by a portion of the dielectric material;
   forming an input region coupled to a first region of the plurality of conductive pillars;
   forming an output region coupled to a second region of the plurality of conductive pillars;
   forming an input line overlying a first region of the semiconductor substrate region and coupled to the input region of the plurality of conductive pillars and to a bond pad;
   forming an output line overlying a second region of the semiconductor substrate region and coupled to the output region of the plurality of conductive pillars and to ground; and
   wherein the dielectric material is selected from air, silicon dioxide, silicon nitride, and silicon oxynitride.

\* \* \* \* \*